United States Patent
Hol et al.

(10) Patent No.: US 7,459,808 B2
(45) Date of Patent: Dec. 2, 2008

(54) LITHOGRAPHIC APPARATUS AND MOTOR

(75) Inventors: Sven Antoin Johan Hol, Yokohama (JP);
Angelo Cesar Peter De Klerk,
Etten-Leur (NL); Erik Roelof Loopstra,
Heeze (NL); Fransicus Mathijs Jacobs,
Asten (NL); Mark Scholten, Buchten
(NL); Arjan Franklin Bakker,
Helenaveen (NL)

(73) Assignee: ASML Netherlands B.V., Veldhoven (NL)

( * ) Notice: Subject to any disclaimer, the term of this patent is extended or adjusted under 35 U.S.C. 154(b) by 164 days.

(21) Appl. No.: 11/273,634

(22) Filed: Nov. 15, 2005

(65) Prior Publication Data

US 2007/0108848 A1   May 17, 2007

(51) Int. Cl.
*H02K 41/00* (2006.01)
*H02K 3/00* (2006.01)
*G03B 27/42* (2006.01)

(52) U.S. Cl. ............... 310/12; 310/15; 310/17; 355/53

(58) Field of Classification Search ............ 310/12–17
See application file for complete search history.

(56) References Cited

U.S. PATENT DOCUMENTS

| | | | | | |
|---|---|---|---|---|---|
| 3,076,110 | A * | 1/1963 | Larson et al. | | 310/194 |
| 5,196,745 | A * | 3/1993 | Trumper | | 310/12 |
| 5,886,432 | A * | 3/1999 | Markle | | 310/12 |
| 6,104,108 | A * | 8/2000 | Hazelton et al. | | 310/12 |
| 6,184,596 | B1 * | 2/2001 | Ohzeki | | 310/12 |
| 6,316,849 | B1 * | 11/2001 | Konkola | | 310/12 |
| 6,353,271 | B1 * | 3/2002 | Williams | | 310/12 |
| 6,445,093 | B1 * | 9/2002 | Binnard | | 310/12 |
| 6,452,292 | B1 * | 9/2002 | Binnard | | 310/12 |
| 6,496,093 | B2 * | 12/2002 | Compter et al. | | 335/229 |
| 6,531,793 | B1 * | 3/2003 | Frissen et al. | | 310/12 |
| 6,717,296 | B2 * | 4/2004 | Hol et al. | | 310/12 |
| 6,987,335 | B2 * | 1/2006 | Korenaga | | 310/12 |
| 6,998,737 | B2 * | 2/2006 | De Weerdt | | 310/12 |
| 7,161,657 | B2 * | 1/2007 | De Weerdt | | 355/53 |
| 7,245,047 | B2 * | 7/2007 | Vreugdewater et al. | | 310/12 |
| 7,385,679 | B2 * | 6/2008 | Dams | | 355/75 |
| 2003/0102721 | A1 * | 6/2003 | Ueta et al. | | 310/12 |
| 2005/0200826 | A1 * | 9/2005 | Schmidt | | 355/72 |
| 2006/0049697 | A1 * | 3/2006 | Binnard | | 310/12 |

* cited by examiner

*Primary Examiner*—Burton Mullins
(74) *Attorney, Agent, or Firm*—Pillsbury Winthrop Shaw Pittman LLP

(57) ABSTRACT

A motor includes a magnet assembly to generate a magnetic field. The field includes along the first direction parts which are alternately orientated in the first and the second direction. The parts extend in a third direction which is perpendicular to the first and the second direction. The motor further includes a first coil winding to carry a first current. The first coil winding to extend in the first direction between parts of the magnetic field orientated in the second direction, to generate the force in the first direction. The motor also includes a second coil winding to carry a second current. The second coil winding to extend in the first direction between parts of the magnetic field substantially orientated in the first direction, to generate the force in the second direction.

27 Claims, 4 Drawing Sheets

LITHOGRAPHIC APPARATUS AND MOTOR

FIELD OF THE INVENTION

The present invention relates to a lithographic apparatus comprising a motor to generate a force in a first and a second direction. Further, the present invention relates to such a motor.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When scanning the pattern or mask, the pattern is required to perform a movement with respect to the beam of radiation. Commonly in the state of the art, a motor assembly is applied thereto. The motor assembly comprises a long stroke motor to perform a coarse positioning of the pattern and a short stroke motor to perform a precise positioning. The long stroke motor thus has a wide range of movement however provides a relatively coarse positioning while the short stroke motor has a relatively small range of movement however provides an accurate positioning. In future designs of a lithographic apparatus, it is desirable to increase a speed of movement of the pattern with respect to the beam of radiation to be able to irradiate a substrate within a shorter time period, thus being able to process a higher number of wafers within a certain time span. On the other hand, a resolution of a pattern to be irradiated onto the substrate is increasing, thus requiring a higher accuracy of a positioning of the pattern to be able to irradiate the pattern onto the substrate with the desired positional accuracy. To cope with a larger detailing of the pattern, a size of the mask may be increased, thereby increasing a weight thereof, thus requiring the motor to accelerate a higher weight load. Also, accelerations to be achieved are increased further, due to the larger size of the mask, and associated higher velocity of movements thereof. Making use of the configuration which is known in which a long stroke motor and a short stroke motor is used, problems as to resonance's and instability come forward now. As the short stroke motor provides for a movement with respect to the long stroke motor, and as these moving parts each may have their own resonance characteristics and limited bandwidth, instability or overshoot may occur which have an adverse effect on a settling time for the pattern to arrive at a desired position. Furthermore, disturbances such as by vibrations may also cause resonance's or other stability problems of the pattern by a combination of a short stroke and a long stroke motor.

SUMMARY

It is desirable to provide an improved motor and a lithographic apparatus comprising such improved motor.

According to an embodiment of the invention, there is provided a lithographic apparatus comprising a motor to generate a force in a first direction and a force in a second direction, the motor comprising a magnet assembly to generate a magnetic field which comprises along the first direction parts which are alternately orientated in substantially the first and the second direction, the parts extending in a third direction substantially perpendicular to the first and second direction, a first coil winding to carry a first current, the first coil winding to extend in the first direction between parts of the magnetic field substantially orientated in the second direction, to generate the force in the first direction, and a second coil winding to carry a second current, the second coil winding to extend in the first direction between parts of the magnetic field substantially orientated in the first direction, to generate the force in the second direction.

In another embodiment of the invention, there is provided a motor to generate a force in a first direction and a force in a second direction, the motor comprising a magnet assembly to generate a magnetic field which comprises along the first direction parts which are alternately orientated in substantially the first and the second direction, the parts extending in a third direction substantially perpendicular to the first and second direction, a first coil winding to carry a first current, the first coil winding to extend between parts of the magnetic field substantially orientated in the second direction, to generate the force in the first direction, and a second coil winding to carry a second current, the second coil winding to extend between parts of the magnetic field substantially orientated in the first direction, to generate the force in the second direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
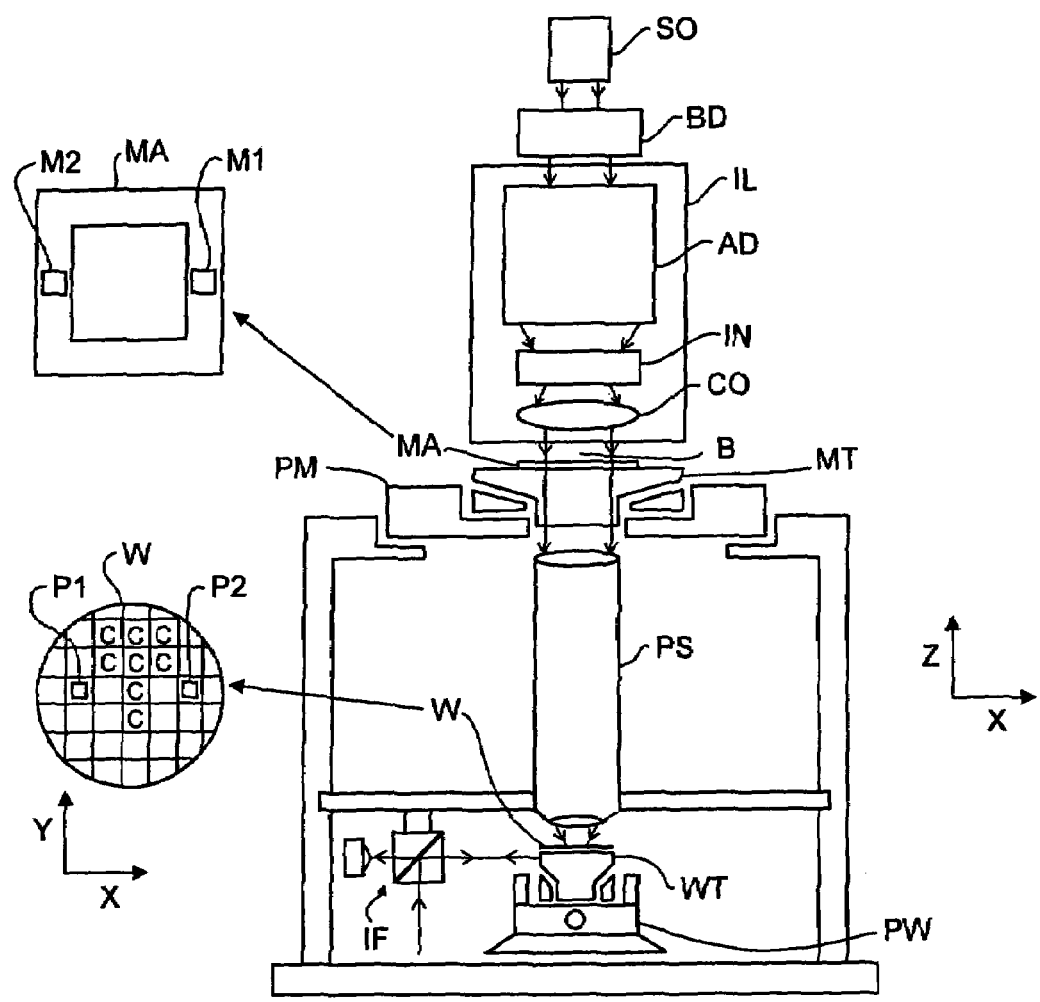
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
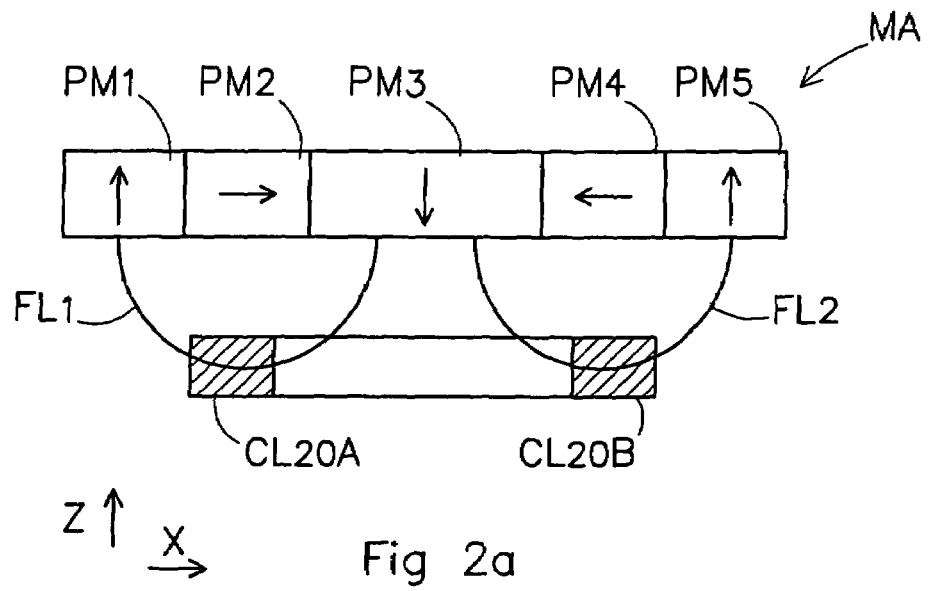
FIGS. 2a and 2b depict schematic, cross sectional views of parts of the motor according to an embodiment of the invention.
Figure 2B:
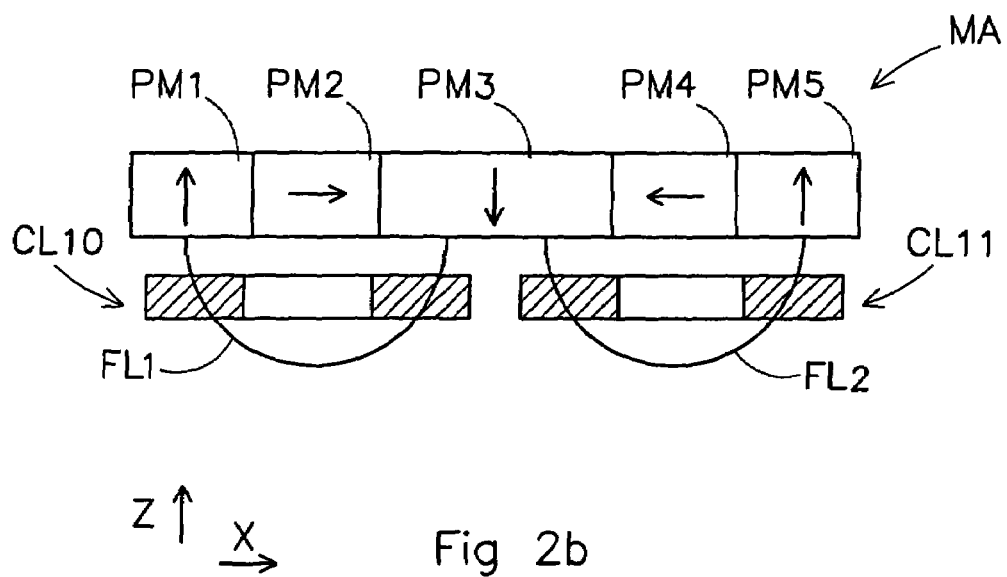

FIGS. 2a and 2b each schematically show a part of a motor according to an embodiment of the invention. A magnet assembly MA comprises a plurality of parallel magnets, in this example PM1-PM5. Polarizations of PM1 and PM5 are directed upwards in a plane of drawing of FIGS. 2a and 2b. A polarization of PM3 is directed downwards and polarizations of PM2 and PM4 are directed sidewards, the polarization PM2 having an orientation from left to right in a plane of drawing and PM4 having an orientation from right to left. PM1, PM2, PM3, PM4 and PM5 are positioned adjacent to each other and may, but not necessarily need to, be in physical contact with each other. FIGS. 2a and 2b show a cross-sectional view in an xz plane, where x represents a horizontal axis in a plane of drawing and z a vertical axis in the plane of drawing. An axis perpendicular to the plane of drawing is thereby represented by y (not shown). The magnets PM1 . . . PM5 may extend in the y direction, and as depicted in FIGS. 2a and 2b, are adjacent to each other in the x direction. In the explanatory embodiment shown in FIGS. 2a and 2b, a width of PM1, PM2, PM4 and PM5 in the x direction is substantially similar, while a width of PM3 is a larger, e.g. approximately twice a width of PM1 or PM5, for example. These dimensions are however an example only, and may be amended. PM2 and PM4 may in this embodiment function to create a Hallbach magnet configuration thereby providing a well defined layout of the magnetic field around by the magnetic assembly. The Hallbach array magnets PM2 and PM4 may also be omitted or replaced by other similar subsidiary magnet arrays to assist in a shaping of field lines of the magnet assembly. A primary magnet system is thus formed by PM1, PM3 and PM5, while a subsidiary magnet system (in this example in a Hallbach configuration) is formed by P2 and P4. Some example of field lines are depicted: field line FL1 extends between PM1 and PM3. Field line FL2 extends between PM3 and PM5. The field lines FL1 and FL2 comprise parts which are alternately directed, or better to say orientated in the x-direction and the z-direction. Field line FL1 is orientated substantially in the z-direction near PM1 and PM3, while there between, field line FL1 is orientated substantially in the x-direction. A same holds for field line FL2 in relation to PM3 and PM5. It is noted that the wording orientation of a field or of a field line, does not make a distinction towards a direction thereof in that orientation, i.e. field line FL1 will near PM1 and near PM3 have a same orientation (i.e. an orientation substantially parallel to the z-axis), while a direction of the field line near PM1 will be opposite to a direction near PM3. Similarly, the part of field line FL1 which is substantially orientated parallel to the x-axis will have a same orientation as a corresponding part of field line FL2, however a direction of these parts will in the example shown here be opposite. It is noted that the wordings oriented parallel to an axis or directed parallel to an axis are to be understood as to mean that the respective field lines have a direction or orientation which is parallel to the axis, however these wordings are not intended to imply a direction: as an example, a field line being orientated or directed in parallel to the x-axis may include a field line from left to right as well as from right to left in the plane of drawing of FIGS. 2a and 2b.

The motor further comprises a first coil winding and a second coil winding. In FIG. 2a, an example of the second coil winding is shown, while in FIG. 2b two examples of the first coil winding are shown. FIG. 2a shows second coil winding which extends along the x-axis, thus in the x-direction, between parts of the magnetic field substantially orientated in the x-direction. The second coil winding is shown in FIG. 2a in cross-sectional view. A conductor part at CL20A of the second coil winding being directed substantially parallel to the y-axis, while a conductor part at CL20B of the second coil winding also extends in that direction. Seen in a xy-plane, the coil may have any suitable shape, e.g. circular, rectangular, square, oval, rectangular having rounded edges, etc. The second coil winding may in operation carry an electrical current. Due to the winding of the conductors forming the coil, a direction of the current at CL20A and CL20B will be opposite: if, for example the current at CL20A is "into" the plane of drawing, then CL20B the current is directed "out of" of the plane of drawing. As explained above, a direction of field line FL1 at CL20A is opposite to the direction of field line FL2 at CL20B. Therefrom, it follows that a force generated by the interaction of the current carried by the second coil winding and the field lines FL1, FL2, will result both at CL20A and CL20B in a force in the z-direction. Depending on a polarity of the current carried by the second coil winding, the force may be towards the magnetic assembly or away from the magnetic assembly.

FIG. 2b shows examples of the first coil winding. It is noted that although in FIG. 2b two first coil windings, i.e. first coil winding CL10 and first coil winding CL11 are shown, embodiments with a single first coil winding may be applied to within the scope of the invention. The first coil CL10 extends between parts from the magnetic field orientated in the second direction, as schematically indicated by the field line FL1. Similarly, the other first coil CL12 extends between parts of the magnetic field orientated in the z-direction and is schematically indicated by FL2. Similarly to the second coil winding CL20A,B, the coils CL10 and CL11 may have any suitable shape when seen in an xy plane, e.g. circular, rectangular, square, oval, rounded etc. The first coil may in operation carry a first current. Due to a construction of the windings, a polarization of the current at the left side of CL10 (thus facing PM1) will be opposite to a polarization at the right side of CL10 (thus facing PM3). For example, when at the left side of CL10 the current is into the plane of drawing, at the right side the current will be out of the plane of drawing. Similarly, a polarization of the field line FL1 near PM1 and PM3 will be substantially opposite, however near PM1 and PM3 the field line FL1 being orientated in both cases substantially in the z-direction. Due to the opposite polarization of the field line and the opposite polarization of the current, a force generated by the interaction of the current with the magnetic field line will have a same direction or substantially same direction at the left side of the winding of CL10 as well as at the right side of the winding of CL10. This force is substantially directed in the x-direction. Similarly to what has been described with reference to CL10, a force in the x-direction may be generated when the winding CL11 carries a current, the force due to an interaction of the current and the magnetic field near PM3 and PM5, schematically indicated here as FL2.

With the magnet assembly MA, a magnetic field is thus created, which comprises parts which are alternately orientated in the x and z-direction. A coil which extends between parts of the magnetic field orientated in the x-direction may now be used to generate a force in the z-direction, while a coil extending between parts of the magnetic field orientated in the z-direction may be used to generate a force in the x-direction, when the respective coil carries a current. Thus, forces may be generated by the motor in two directions, i.e. in this example the x-direction and the z-direction by coils extending between appropriate parts of the magnetic field comprising the alternately orientated parts.

The parallel magnets PM1-PM5 may extend in the y-direction, thereby enabling a large range of movement of the motor in the y-direction. A further magnet assembly may have been provided (not shown in FIGS. 2a and 2b) and a further coil or coils (also not shown in FIGS. 2a and 2b) to generate a force in the y-direction.

One ore more of the coils may have an elongated shape in the y-direction. Thereby, a larger force may be generated due to more interaction between the current carried by that coil and the appropriate part of the magnetic field.

The magnet assembly may in general comprise main magnets, such as the magnets PM1, PM3 and PM5 whose polarization is oriented parallel to the z-direction, while a direction of polarization of each following main magnet is along the x-direction first with respect to a previous main magnet. Thus, a direction of polarization of PM3 is opposite to that of PM1, while a direction of polarization of PM5 is opposite to that of PM3. Subsidiary magnets, such as the magnets PM2, PM4 to create a Hallbach configuration, may be provided in between neighbouring magnets. A direction of polarization of a following subsidiary magnet seen along the x-dimension, may be reversed in respect to a previous subsidiary magnet. In the example shown in FIGS. 2a and 2b, subsidiary magnet PM2 and PM4 each have a direction of polarization orientated substantially parallel to the x-direction, i.e. a polarization of PM2 is to the right while a polarisation of PM4 is the left. In the example shown here, the magnet assembly comprises three main magnets. Thereby, as shown in FIGS. 2a and 2b, two parts in the magnetic field may be realized where the magnetic field is substantially orientated in the x-direction, i.e. the parts were coil parts CL20A, CL20B are provided. Thus, both ends of the coil CL20A,B may be subjected to an appropriate part of the magnetic field, thereby a current in both CL20A and CL20B assists in generating the force in the z-direction, thus providing a high efficiency of a creation of the force in the z-direction. In this configuration, three parts are generated where the magnetic field is orientated in the z-direction, i.e. near PM1, PM3 and PM5. Thereby, two possibilities for placement of a first coil come forward, i.e. extending between the magnetic fields near PM1 and PM3 or between the magnetic fields near PM3 and PM5 respectively. If a width in the x-dimension of PM3 is chosen to be sufficiently a large, e.g. approximately twice a width of PM1 resp. PM5 as depicted in FIGS. 2A and 2B, then it is possible to make use of two first coils, as has been depicted in FIG. 2b. Thereby, twice a force may be generated as compared to a force which could have been generated when using a single one of the first coils CL10, CL11. To be able to generate a large force, it is possible that one or more of the first and second windings is elongated in the y-direction, thereby increasing an area in which the current carried by the respective coil interacts with the magnetic field as described above. An example thereof will be described below.

Figure 3A:
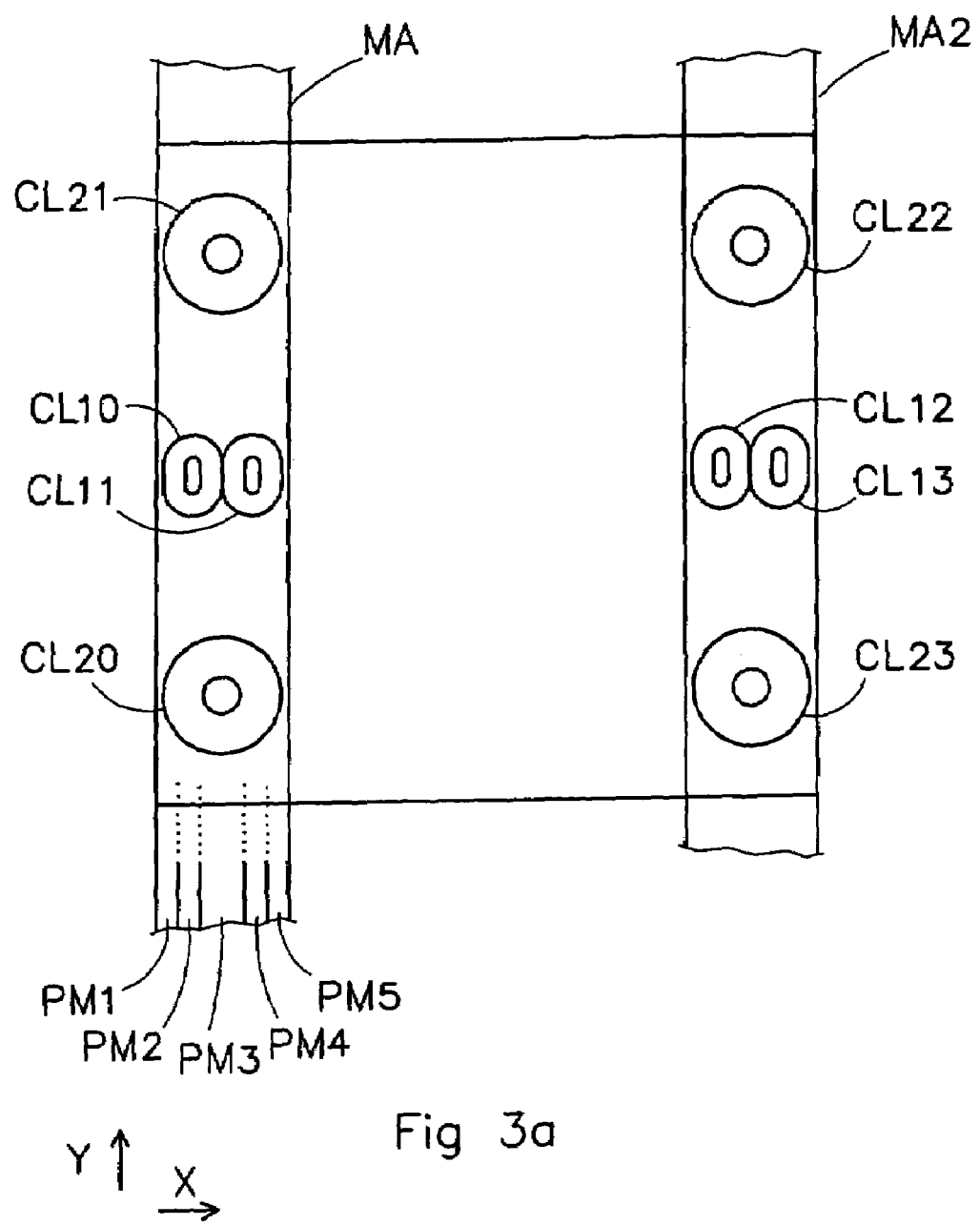
FIGS. 3a and 3b schematically depict a top view and a perspective view of parts of a motor according to an embodiment of the invention.
Figure 3B:
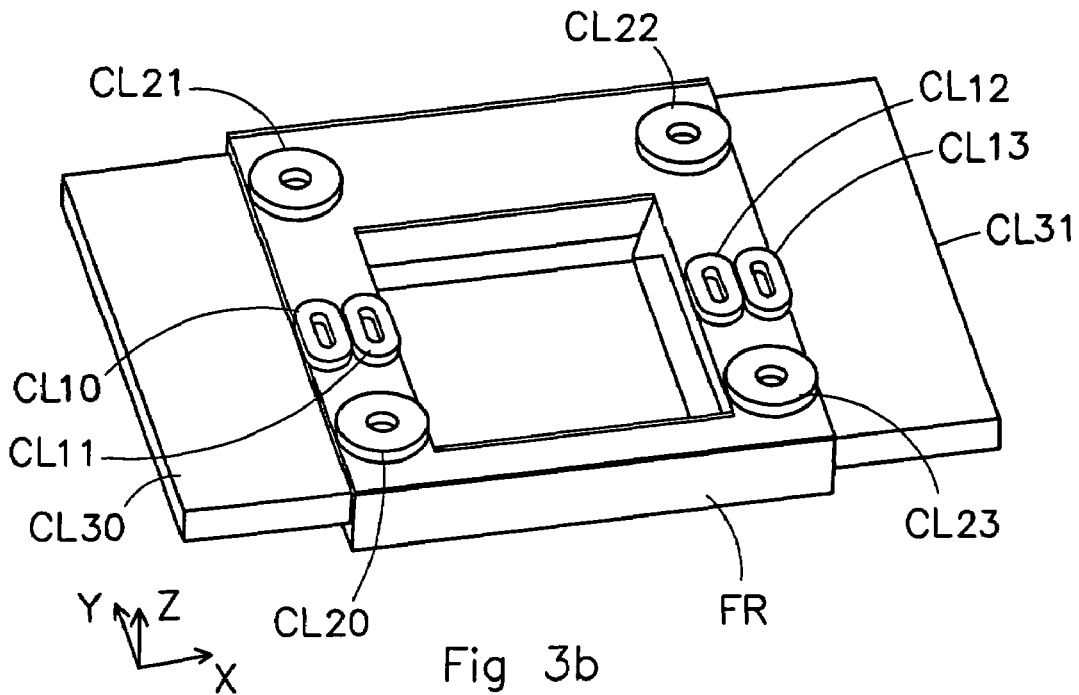

FIGS. 3a and 3b show a top view respectively a perspective view of parts of a motor according to an embodiment of the invention. As depicted in FIG. 3a, the motor comprises a magnet assembly MA and a further magnet assembly MA2. Each of the magnet assemblies MA, MA2 may comprise a plurality of parallel magnets PM1 . . . PM5 extending in the y-direction, thereby creating a magnetic field which along the x-direction alternately changes orientation. The magnet assemblies may be of the construction described with reference to FIGS. 2a and 2b. Thus, each of the magnet assemblies may comprise five parallel magnets extending along the y-axis. The magnet assemblies MA, MA2 may thus be of a same or similar construction as the ones described with reference to FIGS. 2a and 2b, however in FIG. 3a depicted in a top view, i.e. in a view substantially corresponding to the xy-plane. The parallel magnets P1-P5 are symbolically indicated in FIG. 3a for one of the magnet assemblies, namely the magnet assembly MA. For clarity purposes lines which indicate a border between PM1, PM2, PM3, PM4 and PM5 respectively have not been drawn over full length in y-direction of the magnet assembly, however in stead only a small part thereof has been shown. The magnet assembly provides a magnet field having a shape and orientation as described above with reference to FIGS. 2a and 2b. It is noted that, for illustrative purpose, the magnet assemblies MA, MA2 are in FIG. 3A depicted in a "see through" fashion, so as to allow depicting the coils underneath. The motor as depicted in FIG. 3a, comprises four first coils as well as four-second coils. Two of the first coils are positioned in a vicinity of the magnet assembly MA and two of the first coils are positioned in vicinity of the further magnet assembly MA2, to co-operate with the magnetic field by the magnet assembly and the further magnet assembly MA2 respectively. Likewise, two of the second coils CL20, CL21 are positioned in vicinity of the magnet assembly MA to interact with the magnetic field generated thereby while two of the second coils CL22, CL23 are positioned in vicinity of the further magnet assembly MA2 to interact with the magnetic field generated thereby. Each of the first coils CL10, CL11, CL12, CL13 may be of a type and construction as of the first coils as described with reference to FIG. 2b. Each of the second coils may be of a type and construction as described with reference to FIG. 2a. In the configuration in FIG. 3a, the second coils enables to generate a force in the z-direction, i.e. perpendicular to a plane of drawing in FIG. 3a, when the coil carries a current. Each of the first coils is able to generate a force in the x-direction according to the principles set out with reference with FIG. 2b, when a current is carried by the respective coil.

FIG. 3b shows a perspective view of the motor as described with reference to FIG. 3a. It is noted that in FIG. 3b, the magnet assemblies MA, MA2 have been omitted for clarity purposes. The first coils CL10-CL13 and second coils CL20-CL23 may be connected to a structure, in this example a frame FR. The magnet assembly MA may be positioned over the coils CL20, CL21, CL10 and CL11. The magnet assembly MA2 may be positioned over the coils CL22, CL23, CL12 and CL13. A motor may now carry a load by the frame FR as an example, a reticle mask may be carried by the frame FR. The motor may further be provided with third coil windings CL30, CL31 to generate a force in the third direction in co-operation with a third magnet assembly (not shown in FIG. 3b). The force generated by the third windings may be in the y-direction. In this particular application, the reticle mask is able to have a large range of movement in a single direction, i.e. in this example the Y-direction, while only relatively small ranges of movement in the x and the z-direction are required. Thereto, the permanent magnets MA, MA2 may have a length in the y-direction which is larger than a length of the frame FR in the y-direction (as also depicted in FIG. 3A). In particular, a length of the magnet assemblies MA, MA2 may be larger in y-direction by a range of movement in y-direction than a length of the frame FR in y-direction (or than a distance between coils 20 and 21, i.e. the most outer coils which interact with that magnet assembly). A motor has now been provided which enables to generate forces in 6 degrees of freedom, the motor having very compact dimensions. In particular, the motor enables to combine a large range of movement in a single dimension with a high position accuracy and therefore an accurate positioning in one or more of the other dimensions, as provided by one or more of the first and second coils in co-operation with one or more of the magnet assemblies MA, MA2. The fact that the magnet assemblies form a structure which may be extended in one dimension over a large length (in this example the y-dimension) provides for the large range of movement in the y-direction of the first and second coils with respect to the magnet assembly MA respectively MA2.

By providing more than one second coils, several effects may be obtained, some examples thereof being described below. The second coils are able to generate a force in z-direction, as has been described above. By providing two or more second coils carrying a same current, same forces may be generated by the respective coils. Thereby, a torsion of the frame FR may be reduced, e.g. by operating 2, 3 or 4 of the second coils CL20-CL23 simultaneously. Also, the second coils enable to generate rotational forces with respect to the x-axis and the y-axis. For example, when CL20 is driven differently with respect to CL21, or when CL22 is driven differently with respect to CL23, a rotation, or a rotational force with respect to the x-axis acting on the frame FR may be obtained. Similarly, when driving CL20 and CL23 in a different way with respect to each other and/or driving CL21 and CL22 in a different way with respect to each other, a rotational force with respect to the y-axis may be obtained. It is noted that the term driving coils differently is to be understood as providing such a current to each of the coils that a different force is generated by each of the coils. It may be for example the case that both coils are driven to generate an upward force, however having a different value or, alternatively, it is possible that one of the coils is driven to generate a downward force while the other is driven to generate an upward force. A second effect which may be obtained by making use of 4 second coils is that resonance modes of the frame may be suppressed to a certain extent. By the second coils as described above, forces in z-direction and rotational forces with respect to x and y-axis may be generated. Thus, forces may be generated in 3 degrees of freedom. Therefore, in principle only 3 second coils are required. It is thus for example possible to omit one of the second coils e.g. CL23 or CL22. By however providing 4 instead of 3 second coils, an overdetermined system is obtained, which may be applied to suppress resonance modes of the frame FR. Thereto, coils may be driven with an alternating current or an additional alternating current component, the coil by the alternating current generating a force which, using an appropriate phase and frequency of the alternating current, may counteract a resonance of the frame FR. Thereto, a control system may be established which comprises one or more vibration sensors to sense a vibration of the frame, the vibration sensors providing a signal to the control system, the control system from the signal determining an alternating current or alternating current component to be provided to one or more of the second coils.

Figure 4:
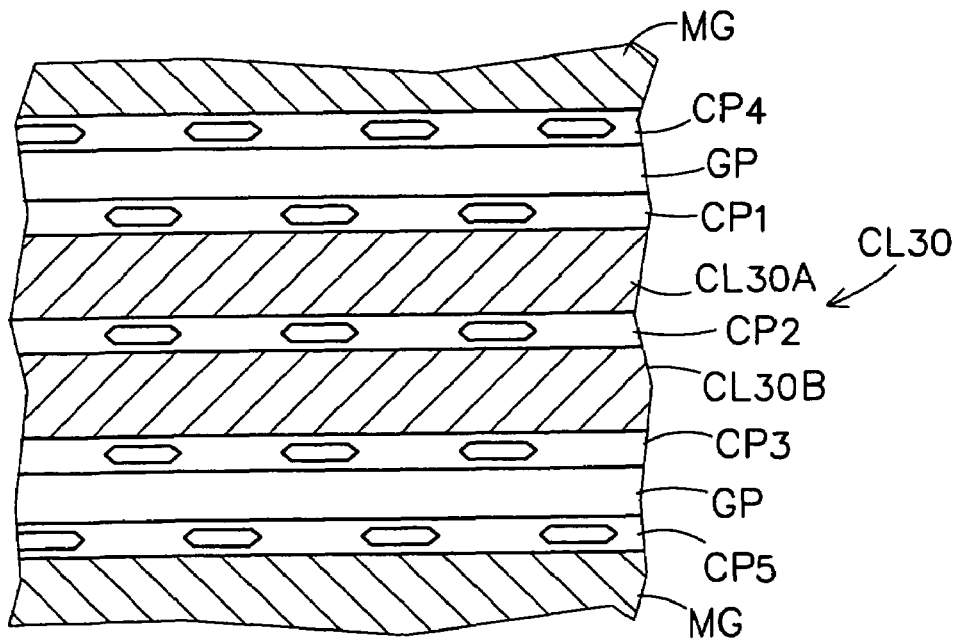
FIG. 4 depicts a cross-sectional view of a part of the motor according to an embodiment of the invention.

The motor as described here further comprises a plurality of first coils. As depicted in FIG. 3b (and has also been described with reference to FIG. 2b) a pair of first coils may have been provided co-operating with a single magnetic assembly. In the x-direction, a size of the first coil windings is approximately a half of a size of the second coil windings. Thereby, use may be made of the shape of the magnetic field as generated by the magnetic assemblies, in that the first coils are sized such as to interact with the parts of the magnetic field where the magnetic field is orientated in the z-direction, as good as possible. By using 2 first coils co-operating with a same magnet assembly, the first coils being e.g. shifted in position with respect to each other in the x-direction, a twice as high force may be generated as with a single first coil (this has also been described with reference to FIG. 2b). It is also possible that the two first coils co-operating with a same magnet assembly are offset with respect to each other in the y-direction. Thereby, a rotational force with respect to the z-axis may be generated by an appropriate driving of these coils. By such a force, displacement of an assembly comprising the frame and other coils may occur, which displacement may in turn generate induction currents in one or more of the other coils, e.g. in the third coils. Thereby, calibrations may be performed for e.g. the third coils, e.g. calibrating a ratio between force generated by a coil and current flowing through that coil. It will be appreciated that such a calibration mechanism may be applied in two ways. The response of the first coils may be calibrated starting from the third coils, and vice versa. In FIGS. 3a and 3b, 4 first coils have been shown, however numerous other configurations are imaginable too, making use of 1, 2, 3, 4, 5, 6 or any other number of first coils. By making use of one or more first coils CL10, CL11 associated with the magnet assembly MA and one or more first coils CL12, CL13 associated with the further magnet assembly MA2, forces on the frame FR may be reduced thereby reducing a dynamic distortion of the frame.

Requirements for the third coil winding CL30, CL31 may differ from that for the first and second coil windings. A high force may be delivered by the third coil winding in combination with an appropriate magnet assembly, and a response of such a motor winding is predictable. In other words, it is desirable that a fluctuation in the force provided by the third coil winding as a function of the current carried by that winding should be low. This is desirable to be able to achieve high accelerations and a fast movement of a reticle mask by the motor, in particular in the y-direction. Various embodiments of the invention are described now which all aid in achieving the above requirements. According to an embodiment of the invention, the third coil winding or third coil windings comprise an aluminium. By making use of aluminium, higher force over weight ratio's may be achieved as compared to a conventional winding comprising e.g. a copper or copper composition. The aluminium winding may comprise an aluminium wire or an aluminium foil. By using aluminium foil, a better heat sourcing may be provided as compared to using aluminium wire. On the other hand, a process of winding may be more easy making use of aluminium wire than when making use of aluminium foil. Further details of the third coil winding and an associated magnet assembly are described with reference to FIG. 4. FIG. 4 shows a cross-sectional view of a part of the coil 30 and an associated magnet assembly comprising magnets MG1, MG2 positioned on opposite sides of the coil CL30. The coil CL30 comprises coil layers CL30A, CL30B which extend in the x, y plane. The layers CL30A, CL30B may each comprise a plurality of wires, such as aluminium wires, and/or a plurality of layers, such as aluminium layers. The inventors have devised that a high temperature stability of the coils and magnets provides a high stability in response of the motor, in other words a low fluctuation in an amount of Newton's generated by the coil over a value of the current guided by the coil. To achieve such a high thermal stability, cooling plates are provided. In the example shown, a cooling plate is CP2 is provided which extends substantially parallel to the third magnet assembly, in other words which extends in the x, y plane. Thereby, a cooling of the third coil winding may be achieved. By positioning the cooling plate CP2 interposed between layers of the third coil winding, a distance between the respective layers CL30A, CL30B and the magnet assembly MG is virtually not increased, thereby not deteriorating an efficiency of the motor. In the example shown here, a single cooling plate is interposed between windings. It will be appreciated that a plurality of cooling plates may be interposed between layers of the third coil winding. As an example, two cooling plates being interposed between three layers, or three cooling plates being interposed between four layers, in both cases a "sandwich" construction being formed which comprises a stacking of a layer of windings, a cooling plate, a layer of windings, a cooling plate, etc. By these "sandwich" constructions, an effective cooling of the layers of windings may be provided, thereby improving a thermal stability of, and thus a stability in response of the motor. The coil winding further comprises cooling plates extending on sides of the coil winding facing the third magnet assembly MG. In this example, cooling plates CP1 and CP3 are provided at outer sides of the coil windings. Thereby, a further cooling of the windings may be provided. The cooling plates CP1, CP2, CP3 may comprise a channel to guide a cooling fluid there through. Any suitable cooling fluid may be used, such as a water, an oil, or a compressed cooling gas such as a freon, a helium, etc. Further, the inventors have realized that a temperature change in the magnet itself may also result in a change in response in the motor. Therefore, cooling plates may be provided on the magnet assembly, in this example cooling plates CP4, CP5, the cooling plates facing a gap GP between the magnet assembly MG and the coil CL30. The cooling plates may have a thickness of approximately 1 mm (in z-direction), channels being provided therein through which a water is circulated as a cooling fluid.

By the cooling due to the cooling plates, the winding may be operated at a high temperature. Due to the high temperature, a high current density may be achieved resulting in a high force to be generated by the motor. The use of the cooling plates now allows a good dimensioning of the motor: a number of cooling plates may be chosen which provides efficient cooling to prevent cooling fluid (such as water) from being heated above its boiling point. Further, by the cooling plates provided on the magnets, an efficiency of the motor is decreased to some extent, because a distance between the windings and the magnets is increased somewhat. This is however balanced by an increase in stability, as described above, as due to the cooling of the magnets, a temperature stability thereof will increase, which results in a more stable K-factor of the motor as the K-factor shows a temperature dependency.

As a further improvement, it is possible that the motor as described here is supplemented by a cable shuttle motor to be able to reduce a load of the motor in that the cable shuttle motor provides for a positioning of the cable such that the cable follows a movement of the motor. Thereto, a movement of the cable shuttle may be substantially synchronous to a movement of e.g. the frame FR in FIG. 3b.

The magnet assemblies may further comprise a so called back iron, thus an iron part which extends along a side of the magnet assembly facing away from the coils, thereby improving the magnetic field to which the coils are subjected.

Also, it is possible to connect a metal part to e.g. one of more of the first coils (e.g. at a side thereof facing away from the magnet assembly in FIGS. 2A and 2B), thereby generating an upward force to at least partly compensate for a downward, gravitational force on the coil(s) as well as the frame.

The magnet assemblies as depicted in FIGS. 2a, 2b and 3a are examples to achieve a magnetic field which along a first (i.e. in this example x) direction alternately changes direction, the field being alternately directed in the first (i.e. in this example the x-) direction and a second (i.e. in this example the z-direction), perpendicular to the first direction, the along the first direction alternately changing field extending in a third direction (i.e. in this example the y-direction). Many alternatives for the shown magnet assemblies are possible. As an example, the magnet assembly, the subsidiary magnets (such is in the examples shown here the magnets PM 2, PM 4) may be omitted, thus e.g. only making use of magnets having a direction of polarisation orientated in the second direction. Also, it may be possible to make use of dual magnet assemblies per coil, thereby e.g. creating a "sandwich" construction where the first and second coils are subjected to a magnetic field generated by magnet assemblies on both sides of the coils: as an example, in the FIGS. 2a and 2b embodiments, a supplementary magnet assembly may be positioned below the coils. Instead of or in addition to permanent magnets, other device or system to generate such a magnetic field may include electromagnets, or any magnetizable material such as a plastic. Also, superconducting coils may be applied.

Although in the examples shown, reference is made to an x, y and z direction of a coordinate system, the skilled person will appreciate that any direction and orientation of the motor may be applied, thus instead of the x, y and z direction, generally speaking any first, second and third direction may be applied.

The motor may generate a force in the first direction and a force in the second direction. The first and second direction in the examples shown are substantially perpendicular to each other, thereby creating a motor which provides independent control of force in 2 dimensions which are perpendicular to each other—thereby facilitating a driving of the motor (e.g. in a control system). In general, the first and second direction may however deviate from each other by more or less than 90 degrees.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising a motor to generate a force in a first direction and a force in a second direction, the motor comprising:
    a magnet assembly to generate a magnetic field which comprises along the first direction parts which are alternately orientated in substantially the first and the second direction, the parts extending in a third direction substantially perpendicular to the first and second direction,
    a first coil winding to carry a first current, the first coil winding to extend in the first direction from a first part to a second part of the magnetic field substantially orientated in the second direction and along a third part of the magnetic field oriented along the first direction and located between the first and second parts, the first and second parts of the magnetic field to interact with the first coil winding to generate the force in the first direction, and
    a second coil winding to carry a second current, the second coil winding to extend in the first direction between parts of the magnetic field substantially orientated in the first direction, to generate the force in the second directions,
    wherein the first and the second coil windings are spaced apart from each other in the third direction.

2. The lithographic apparatus according to claim 1, wherein the magnet assembly comprises substantially parallel magnets extending in the third direction which is substantially perpendicular to the first and the second direction.

3. The lithographic apparatus according to claim 2, wherein the substantially parallel magnets comprise main magnets each having a polarization orientated in parallel to the second direction, a direction of polarization of each of the main magnets, along the first direction, being opposite to a previous main magnet.

4. The lithographic apparatus according to claim 3, wherein the substantially parallel magnets further comprise subsidiary magnets that each have a polarization orientated substantially parallel to the first direction, a direction of polarization of each of the subsidiary magnets, along the first direction, being opposite to a previous subsidiary magnet.

5. The lithographic apparatus according to claim 3, wherein the magnet assembly comprises three main magnets.

6. The lithographic apparatus according to claim 5, wherein a width along the first direction of a middle one of the main magnets is substantially twice a width of a remainder of the main magnets.

7. The lithographic apparatus according to claim 1, wherein at least one of the first and the second coil windings is elongated in the third direction which is substantially perpendicular to the first and the second direction.

8. The lithographic apparatus according to claim 1, wherein the motor comprises a further magnet assembly, offset in the first direction with respect to and substantially parallel to the magnet assembly, the motor further comprising at least another second coil winding to cooperate with the further magnet assembly.

9. The lithographic apparatus according to claim 1, wherein in the first direction a width of the first coil winding is substantially a half of a width of the second coil winding.

10. The lithographic apparatus according to claim 9 wherein the motor comprises two first coil windings cooperating with the magnet assembly, the two first coil windings being offset with respect to each other in at least the first direction.

11. The lithographic apparatus according to claim 1, wherein the motor is a reticle stage motor to exert a force on the reticle stage.

12. The lithographic apparatus according to claim 1, wherein the first direction is substantially perpendicular to the second direction.

13. A lithographic apparatus comprising a motor to generate a force in a first direction and a force in a second direction, the motor comprising:

a magnet assembly to generate a magnetic field which comprises along the first direction parts which are alternately orientated in substantially the first and the second direction, the parts extending in a third direction substantially perpendicular to the first and second direction, a first coil winding to carry a first current, the first coil winding to extend in the first direction from a first part to a second part of the magnetic field substantially orientated in the second direction and along a third part of the magnetic field oriented along the first direction and located between the first and second parts, the first and second parts of the magnetic field to interact with the first coil winding to generate the force in the first direction, and at least two second coil windings, each of the second coil windings configured to carry a second current and extend in the first direction between parts of the magnetic field substantially orientated in the first direction, to generate the force in the second direction, wherein the at least two second coil windings are spaced apart from each other in the third direction.

14. The lithographic apparatus according to claim 13 wherein the motor comprises a further magnet assembly, offset in the first direction with respect to and substantially parallel to the magnet assembly, the motor further comprising at least another second coil winding to cooperate with the further magnet assembly.

15. The lithographic apparatus according to claim 14 wherein the motor comprises four second coil windings, two second coil windings configured to cooperate with the magnet assembly and being spaced apart from each other in the third direction and two second coil windings configured to cooperate with the further magnet assembly and being mutually spaced with respect to each other in the third direction.

16. The lithographic apparatus according to claim 15 wherein in the first direction a width of the first coil winding is substantially a half of a width of the second coil winding, wherein the motor comprises two first coil windings cooperating with the magnet assembly, the two first coil windings being offset with respect to each other in at least the first direction, the two first coil windings being interposed between the two second coil windings cooperating with the magnet assembly.

17. The lithographic apparatus according to claim 16, wherein the motor further comprises a further two first coil windings to cooperate with the further magnet assembly, the further two first coil windings being interposed between the two second coil windings to cooperate with the further magnet assembly.

18. The lithographic apparatus according to claim 17, wherein the two first coil windings are offset in the third direction with respect to the further two first coil windings.

19. A lithographic apparatus comprising a motor to generate a force in a first direction and a force in a second direction, the motor comprising:

a magnet assembly to generate a magnetic field which comprises along the first direction parts which are alternately orientated in substantially the first and the second direction, the parts extending in a third direction substantially perpendicular to the first and second direction;

a first coil winding to carry a first current, the first coil winding to extend in the first direction from a first part to a second part of the magnetic field substantially orientated in the second direction and along a third part of the magnetic field oriented along the first direction and located between the first and second parts, the first and second parts of the magnetic field to interact with the first coil winding to generate the force in the first direction;

a second coil winding to carry a second current, the second coil winding to extend in the first direction between parts of the magnetic field substantially orientated in the first direction, to generate the force in the second direction, and an additional magnet assembly to cooperate with a third coil winding to generate a force in the third direction, wherein the first and the second coil windings are spaced apart from each other in the third direction.

20. The lithographic apparatus according to claim 19, wherein the third coil winding comprises an aluminum winding.

21. The lithographic apparatus according to claim 20 wherein the aluminum winding comprises a foil comprising aluminum.

22. The lithographic apparatus according to claim 21 wherein the third coil winding comprises at least one cooling plate interposed between layers of the third coil winding, the cooling plate extending substantially parallel to the third magnet assembly.

23. The lithographic apparatus according to claim 22, wherein the third coil winding further comprises cooling plates extending along sides of the coil winding facing to and facing away the additional magnet assembly.

24. The lithographic apparatus according to claim 22, wherein the at least one cooling plate comprises a channel configured to guide a cooling fluid through the respective cooling plate.

25. The lithographic apparatus according to claim 22, wherein the additional magnet assembly comprises a magnet assembly cooling plate.

26. The lithographic apparatus according to claim 22, wherein the magnet assembly cooling plate is located at a side of the magnet assembly facing the third coil winding.

27. A motor to generate a force in a first direction and a force in a second direction, the motor comprising:

a magnet assembly to generate a magnetic field which comprises along the first direction parts which are alternately orientated in substantially the first and the second direction, the parts extending in a third direction substantially perpendicular to the first and second direction, a first coil winding to carry a first current, the first coil winding to extend from a first part to a second part of the magnetic field substantially orientated in the second direction and along a third part of the magnetic field oriented along the first direction and located between the first and second parts, the first and second parts of the magnetic field to interact with the first coil winding to generate the force in the first direction, and a second coil winding to carry a second current, the second coil winding to extend between parts of the magnetic field substantially orientated in the first direction, to generate the force in the second direction, wherein the first and the second coil windings are spaced apart from each other in the third direction.

* * * * *